United States Patent
Liaw et al.

(10) Patent No.: US 8,120,094 B2
(45) Date of Patent: Feb. 21, 2012

(54) SHALLOW TRENCH ISOLATION WITH IMPROVED STRUCTURE AND METHOD OF FORMING

(75) Inventors: Jhon-Jhy Liaw, Hsin-Chu (TW); Chao-Cheng Chen, Hsin-Chu (TW); Chia-Wei Chang, Wufong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 596 days.

(21) Appl. No.: 11/838,666

(22) Filed: Aug. 14, 2007

(65) Prior Publication Data

US 2009/0045482 A1     Feb. 19, 2009

(51) Int. Cl.
*H01L 29/94* (2006.01)
*H01L 29/76* (2006.01)
*H01L 31/062* (2006.01)
*H01L 31/119* (2006.01)
*H01L 31/113* (2006.01)

(52) U.S. Cl. .............. 257/328; 257/334; 257/E27.091; 438/296

(58) Field of Classification Search .................. None
See application file for complete search history.

(56) References Cited

U.S. PATENT DOCUMENTS

| | | | |
|---|---|---|---|
| 5,316,965 A | 5/1994 | Philipossian et al. | |
| 5,915,192 A | 6/1999 | Liaw et al. | |
| 5,950,093 A | 9/1999 | Wei | |
| 5,972,758 A * | 10/1999 | Liang ........................ | 438/294 |
| 6,008,131 A | 12/1999 | Chen | |
| 6,069,058 A | 5/2000 | Hong | |
| 6,207,532 B1 | 3/2001 | Lin et al. | |
| 6,207,535 B1 | 3/2001 | Lee et al. | |
| 6,232,202 B1 * | 5/2001 | Hong .......................... | 438/424 |
| 6,238,996 B1 | 5/2001 | Liu et al. | |
| 6,251,735 B1 | 6/2001 | Lou | |
| 6,251,750 B1 * | 6/2001 | Lee ........................... | 438/432 |
| 6,251,783 B1 | 6/2001 | Yew | |
| 6,274,457 B1 | 8/2001 | Sakai et al. | |
| 6,287,938 B2 | 9/2001 | Lee et al. | |
| 6,313,007 B1 | 11/2001 | Ma et al. | |
| 6,313,008 B1 * | 11/2001 | Leung et al. ................ | 438/424 |
| 6,329,261 B1 | 12/2001 | Kishimoto | |
| 6,331,469 B1 | 12/2001 | Park et al. | |
| 6,335,540 B1 | 1/2002 | Zhang | |
| 6,337,255 B1 | 1/2002 | Bradl et al. | |

(Continued)

OTHER PUBLICATIONS

Okuno, M., et al., "45-nm Node CMOS Integration with a Novel STI Structure and Full-NCS Interlayers for Low-Operation-Power (LOP) Applications," Electron Devices Meeting, 2005, IEDM Technical Digest, IEEE International, pp. 1-3.

*Primary Examiner* — Zandra Smith
*Assistant Examiner* — Khanh Duong
(74) *Attorney, Agent, or Firm* — Slater & Matsil, L.L.P.

(57) ABSTRACT

A shallow trench isolation (STI) structure has a top portion tapering in width from wide to narrow in a direction from a substrate surface, from a first width at a top of the first portion to a second width at a bottom of the first portion. The STI structure also includes a bottom portion below the top portion, which expands from the bottom of the top portion to a substantially widened lateral distance having a third width. The third width is, in general, substantially larger than the second width. The inventive STI structure can provide desired isolation characteristics with a significantly reduced aspect ratio, thus suitable for device isolations in advanced processing technology.

19 Claims, 6 Drawing Sheets

U.S. PATENT DOCUMENTS

| | | |
|---|---|---|
| 6,342,428 B1 | 1/2002 | Zheng et al. |
| 6,352,591 B1 | 3/2002 | Yieh et al. |
| 6,358,818 B1 | 3/2002 | Wu |
| 6,413,827 B2 | 7/2002 | Farrar |
| 6,426,300 B2 | 7/2002 | Park et al. |
| 6,472,301 B1 | 10/2002 | Lin et al. |
| 6,500,727 B1 | 12/2002 | Chen et al. |
| 6,512,283 B2 | 1/2003 | Davies |
| 6,514,805 B2 | 2/2003 | Xu et al. |
| 6,521,538 B2 * | 2/2003 | Soga et al. ............... 438/695 |
| 6,537,888 B2 | 3/2003 | Lee |
| 6,541,349 B2 | 4/2003 | Arthanari et al. |
| 6,544,860 B1 | 4/2003 | Singh |
| 6,544,861 B2 | 4/2003 | Joo |
| 6,562,696 B1 | 5/2003 | Hsu et al. |
| 6,573,143 B1 | 6/2003 | Li et al. |
| 6,583,020 B2 | 6/2003 | Uhlig et al. |
| 6,617,251 B1 | 9/2003 | Kamath et al. |
| 6,630,699 B1 | 10/2003 | Wylie |
| 6,635,945 B1 | 10/2003 | Ishitsuka et al. |
| 6,649,996 B2 | 11/2003 | Miller et al. |
| 6,653,201 B2 | 11/2003 | Chung |
| 7,038,289 B2 | 5/2006 | Marty et al. |
| 7,276,768 B2 * | 10/2007 | Furukawa et al. ............ 257/374 |
| 7,339,253 B2 * | 3/2008 | Tsai et al. .................... 257/522 |
| 7,391,096 B2 * | 6/2008 | Jung ............................. 257/510 |
| 7,442,618 B2 * | 10/2008 | Chong et al. .................. 438/424 |
| 7,696,569 B2 * | 4/2010 | Fujimoto et al. .............. 257/330 |
| 2004/0026761 A1 | 2/2004 | Leonardi et al. |
| 2006/0263991 A1 * | 11/2006 | Lee et al. ...................... 438/296 |

* cited by examiner

*FIG. 5B* and precisely controlled well doping profile, may be employed to alleviate these problems, these remedies involve increased processing complexity and are generally very difficult to conduct in advanced technology.

SHALLOW TRENCH ISOLATION WITH IMPROVED STRUCTURE AND METHOD OF FORMING

TECHNICAL FIELD

The present invention relates generally to semiconductor integrated circuits, and more particularly, to shallow trench isolations having improved structures and method of forming the same.

BACKGROUND

Shallow trench isolation (STI) is widely adopted in an integrated circuit (IC) to provide electrical isolation between adjacent semiconductor devices formed in a substrate. In a CMOS IC, STIs are typically formed between like kinds of NMOS or PMOS transistors in a given well or substrate to suppress leakage current between neighboring devices. These are generally referred to as intra-well isolations. STIs may also be formed between NMOS and PMOS transistors formed in separate wells. STIs thus formed are generally referred to as inter-well isolations and are typically used to suppress leakage current between neighboring devices of opposite-type and/or to prevent CMOS latchup from happening, which typically causes device failure.

Figure 1:
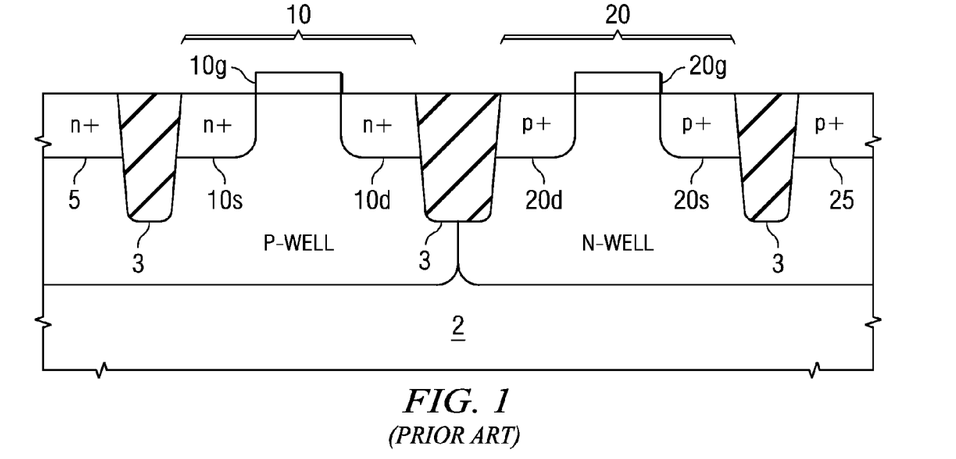
FIG. 1 is a cross-sectional view of a semiconductor device having a prior art STI structure.

FIG. 1 shows a cross-sectional view of a semiconductor device, where prior art STIs 3 are used to isolate MOS transistors formed in semiconductor substrate 2. A P-well and an N-well are formed in a twin-well CMOS manufacturing process. NMOS and PMOS transistors 10 and 20 are then formed in the P-well and N-well, respectively, having source/drain regions and gate regions of 10s, 10d, 10g, and 20s, 20d, 20g. STIs 3 are formed to separate n+ region 10d of NMOS transistor 10 and p+ region 20d of PMOS transistor 20. STIs 3 are also created to separate n+ region 10s and an adjacent n+ region 5 in the P-well, p+ region 20s and an adjacent p+ region 25 in the N-well, respectively. Typically, forming STI 3 involves creating shallow trench into semiconductor substrate 2 through an anisotropic etch process, filling the trench with a dielectric material, such as CVD silicon oxide (SiO$_2$), and removing the excess dielectric using a planarization process, such as chemical mechanic polishing (CMP). In general, the inter-well STI isolation spacing (i.e., n+-to-p+) is substantially wider than the minimum intra-well STI isolation spacing (i.e., n+-to-n+ or p+-to-p+) in order to provide desired isolation effects. This general principle is schematically illustrated in FIG. 1.

However, as the trend of integrating more and more circuit functions in a single IC continues, the structure of existing STIs is gradually becoming one of the major bottlenecks for the further device feature size scaling in advanced technology. Furthermore, a simple feature size shrinkage on an existing STI can lead to deteriorated isolation characteristics and poor device performance. One drawback or challenge related to the structure of a conventional STI 3 in advanced processing technology is that a shrunken inter-well STI typically reduces the n+-to-N-well and p+-to-P-well spacing. When this spacing gets too small, the threshold voltage to turn on the channel regions of the parasitic field device along the side walls of an STI will become very low. Hence, leakage current may substantially increase along the P-well-to-STI, and N-well-to-STI interfaces. Additional detrimental effects include lateral punchthrough in the parasitic device and latchup in the CMOS circuits. Although conventional remedies, such as an increased well dopant concentration and a precisely controlled well doping profile, may be employed to alleviate these problems, these remedies involve increased processing complexity and are generally very difficult to conduct in advanced technology.

Secondly, due to the reduced dimension of an inter-well STI, the tolerance for a misalignment during the photolithography process of forming the N-well and P-well is significantly reduced. Such a misalignment can easily cause a short between a P-well and an adjacent p+ region, and between an N-well and an adjacent n+ region, which may subsequently lead to a device malfunction and device failure. These and other drawbacks and processing difficulties cast great challenges on fitting a conventional STI in advanced technology.

On the other hand, the continuous scaling of device feature size in advanced technology has reached a point that suggests inter-well STI spacing of about the same as intra-well STI spacing, in order to reach the expected large circuit density on an IC and maintain the desired device performance.

One prior art STI embodiment aiming to address the device isolation needs in advanced technology includes a top portion having a straight sidewall and an enlarged bottom portion, as described in co-assigned, U.S. Pat. No. 5,915,192 to Liaw, et al, the disclosure of which is hereby incorporated for reference herein. However, during the process of forming this prior art STI structure, a significant amount of voids and seams are formed in the dielectric material which is filled into the opening of the STI. This leads to poor isolation characteristics, low STI yield and degradation of STI reliability.

Another prior art STI structure is described in "45-nm Node CMOS Integration with a Novel STI Structure and Full-NCS Interlayers for Low-Operation-Power (LOP) Applications" by M. Okuno, et al., Electron Devices Meeting, 2005. IEDM Technical Digest, IEEE International. The disclosure is hereby incorporated for reference. This simulated STI structure includes a locally oxidized STI bottom and a SiN liner (shown in FIG. 16 in said prior art) located between the STI filling material and the semiconductor substrate. The bottom portion, however, is not substantially enlarged to provide desirable isolation characteristics in advanced technology.

In view of these and other problems relating to a conventional STI and other prior art STI structures, there is a need for improved STI structures and method of forming in order to provide the desired STI isolation characteristics in advanced technology and, in the meantime, keep the manufacturing process cost-effective and robust in operation.

SUMMARY OF THE INVENTION

These and other problems are generally solved or circumvented, and technical advantages are generally achieved, by preferred embodiments of the present invention which provide an STI structure that, in general, comprises a tapered, trench-shaped top portion and a substantially widened bottom portion with various shapes. The embodied STI structures exhibit the desired isolation characteristics with a significantly reduced aspect ratio, thus suitable for device isolations in advanced technology generation. The process of forming the embodied STI structures does not involve adding complex, error-prone processing steps.

In accordance with a preferred embodiment of the present invention, a semiconductor structure comprises a semiconductor substrate and a trench located in said semiconductor substrate. The trench has a first portion tapering in width from wide to narrow in a direction from a substrate surface, from a first width at a top of the first portion to a second width at a bottom of the first portion. The trench also includes a second portion, which locates below the first portion. The second portion has a cavity that expands from the bottom of the first portion to a lateral distance having a third width. A filler material is filled in the trench and in direct contact with said semiconductor substrate. Also, the third width is substantially larger than the second width.

In accordance with another preferred embodiment of the present invention, a semiconductor device comprises a substrate having a first, a second active region and a trench isolation. The trench isolation is located in said substrate separating the first and second active region. The trench isolation has a first portion tapering in width from wide to narrow in a direction from a substrate surface, from a first width at a top of the first portion to a second width at a bottom of the first portion. The trench isolation also includes a second portion below the first portion. The second portion has a widened shape that expands from the bottom of the first portion to a lateral distance having a third width, which is substantially larger than the second width.

In accordance with a further preferred embodiment of the present invention, a semiconductor device comprises a semiconductor substrate having a logic region and a memory cell region. The semiconductor device also comprises a plurality of active regions located in said logic region and said memory cell region. The semiconductor device further comprises a first plurality of isolations of a first type located in said logic region, separating adjacent ones of said plurality of active regions, and a second plurality of isolations of a second type located in said memory cell region; separating adjacent other ones of said plurality of active regions. Each of the plurality of isolations of the first type has a trench shape. Each of the plurality of isolations of the second type comprises a first portion tapering in width from wide to narrow in a direction from a surface of the semiconductor substrate, from a first width at a top of the first portion to a second width at a bottom of the first portion; and a second portion below the first portion. The second portion has a widened shape that expands from the bottom of the first portion to a lateral distance having a third width, the third width being larger than the second width.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an improved STI structure and the method of forming the same. This inventive STI structure, in general, comprises a tapered, trench-shaped top portion and a substantially widened bottom portion with various shapes. The embodied STI structures exhibit the desired isolation characteristics for the advanced technology generation. The process of forming the embodied STI structures does not involve adding complex, error-prone processing steps. To clarify description and avoid repetition, like numerals and letters used to describe the prior art in FIG. 1 will be used for the various elements in the coming figures. Also, reference numbers described in FIG. 1 may not be described again in detail herein.

Figure 2A:
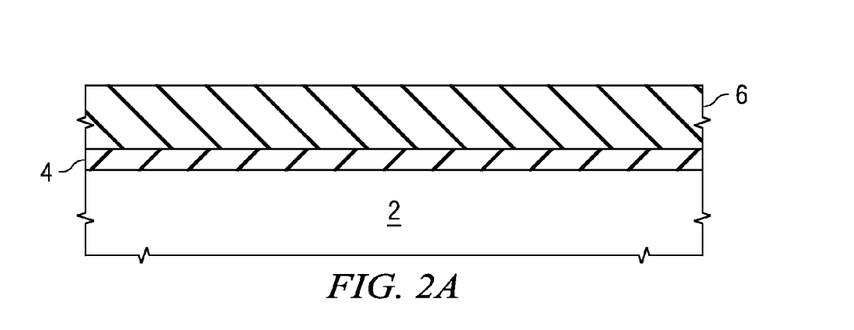
FIGS. 2A-2H show the cross-sectional and layout views of various processing steps in forming device isolations according to the principles of one embodiment of the current invention.

Starting with FIG. 2A, semiconductor substrate 2 is provided. In a preferred embodiment, semiconductor substrate 2 is a P-type silicon substrate with a desired doping concentration. In other embodiments, substrate 2 may be a silicon germanium, gallium arsenide, compound semiconductor, multi-layers semiconductor, silicon on insulator (SOI), germanium on insulator (GeOI), and the like. From hereafter, "semiconductor substrate" is used to refer to the starting semiconductor substrate 2, while "substrate" is used to refer to a finished wafer surface after an intermediate process step in a preferred embodiment.

First dielectric layer 4 is formed atop semiconductor substrate 2. In a preferred embodiment, dielectric layer 4 is a thermal oxide layer (e.g., $SiO_2$ layer) formed by a known thermal oxidation process, having a thickness of from about 30 Å to about 500 Å. In an additional and/or alternative embodiment, dielectric layer 4 comprises a nitrogen-containing oxide layer (e.g., an oxynitride layer). In a further additional and/or alternative embodiment, dielectric layer 4 comprises a dielectric material having a high dielectric constant (high K). In an even further additional and/or alternative embodiment, dielectric layer 4 has a multi-layer configuration. In yet additional and/or alternative embodiments, dielectric layer 4 is formed as a pad layer to cushion the transition of stress between semiconductor substrate 2 and subsequent layers formed thereon. Hence, other suitable dielectric materials and processes of forming a pad layer are not excluded from forming dielectric layer 4 in the various embodiments of the present invention.

Next, second dielectric layer 6 is formed atop dielectric layer 4. In an additional and/or alternative embodiment, dielectric layer 6 is a silicon nitride (e.g., $Si_3N_4$, $SiN_x$) layer formed by a known low pressure chemical vapor deposition (LPCVD) process, having a thickness of from about 1500 Å to about 3000 Å. In other additional and/or alternative embodiments, dielectric layer 6 may comprise a nitrogen-containing oxide layer, a high K dielectric layer, a dielectric layer having a multi-layers configuration, and any combination of such materials. Other suitable processes of forming dielectric layer 6 may include chemical vapor deposition (CVD), plasma enhanced chemical vapor deposition (PECVD), and the like.

Figure 2B:
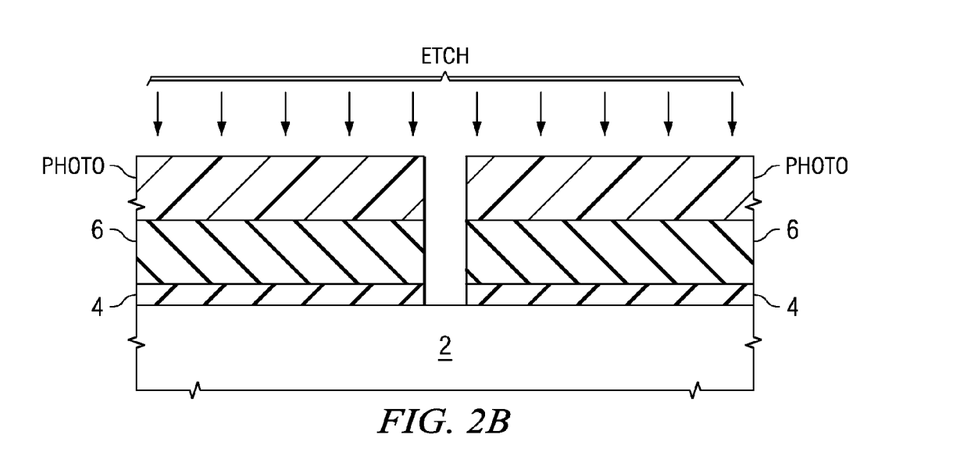

Continuing in FIG. 2B, a photoresist layer is coated on the substrate surface. A known photolithography process is applied to the substrate, patterning and exposing dielectric layer 6 surface area, where STI is formed in semiconductor substrate 2 to isolate adjacent devices. These devices are formed in subsequent processing steps in a CMOS process flow.

Subsequently, a known dry etch process is applied on the substrate to remove dielectric layers 6 and 4 in the exposed areas on the substrate surface. In one preferred embodiment, an anisotropic plasma etch process is conducted in a conventional plasma etch chamber. The etchant gas is a mixture of $CF_4$, $CH_2F_2$, and Ar. The etch process continues until the exposed portions of first and second dielectric layers 4 and 6 are substantially removed. Underlying silicon substrate 2 acts as an etch stop layer. In additional and/or alternative embodiments, an anisotropic reactive ion etch (RIE) may be used to remove the exposed portions of first and second dielectric layers 4 and 6, although other suitable dry etch processes are not excluded. In preferred embodiments, a 5%~10% over etch time is preferably conducted in order to assure complete removal of dielectric layers 4 and 6 in the exposed areas.

Figure 2C:
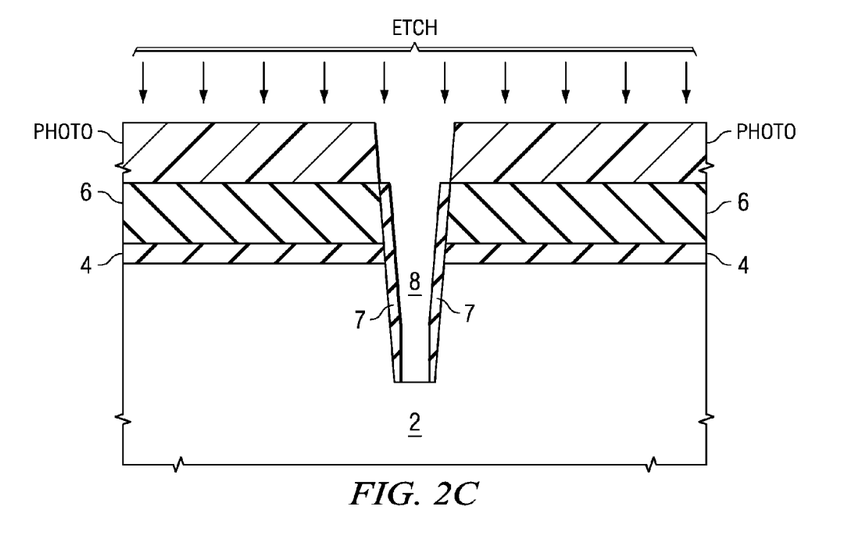

Shown in FIG. 2C, a second dry etch process is subsequently applied on the substrate to create trench 8 in semiconductor substrate 2. In one preferred embodiment, the etch process is an in-situ, anisotropic plasma etch process conducted in a same plasma etch chamber. This etch process is a time-controlled process, and it continues until trenches with predetermined depth are created in semiconductor substrate 2. In one preferred embodiment, trench 8 has a depth of from about 1000 Å to about 5000 Å. In additional and/or alternative embodiments, trench 8 has an aspect ratio (i.e., trench depth versus trench width) greater than 5:1.

It should be noted that, in forming trench 8 in the above described preferred embodiments, a particular processing effort is devoted to controlling the trench profile. A tapered trench profile is preferred to facilitate a desired void-free, seam-free filling by the dielectric material that is filled into trench 8 in later processing steps. In one embodiment, a tapered trench profile with an approximate slope of 85° is obtained through an anisotropic plasma etch process, where the etchant gas is a mixture of $Cl_2$, HBr, $CH_2F_2$, and $O_2$. The flow rate of the carrier gas is adjusted to maintain a pressure of between about 5 mTorr and about 30 mTorr in the etching chamber. During this etch process, the substrate is DC biased between about 100 volts and about 300 volts, while an RF discharge having a power greater than 1000 Watts is released into the etch chamber. Moreover, the current etching process parameters (also generally referred to as an etch recipe) also facilitate the formation of a desired polymer deposition 7 on the sidewalls of trench 8. Polymer deposition 7 acts as an etch stop layer for a subsequent third etch process. Its growth rate is primarily controlled by varying the ratio of the polymerizing gas $CH_2F_2$ in an etchant gas mixture.

In additional and/or alternative embodiments of the present invention, other known dry etch recipes capable of forming a tapered trench profile and sidewall polymer deposition may also be used in forming trench 8.

Figure 2D:
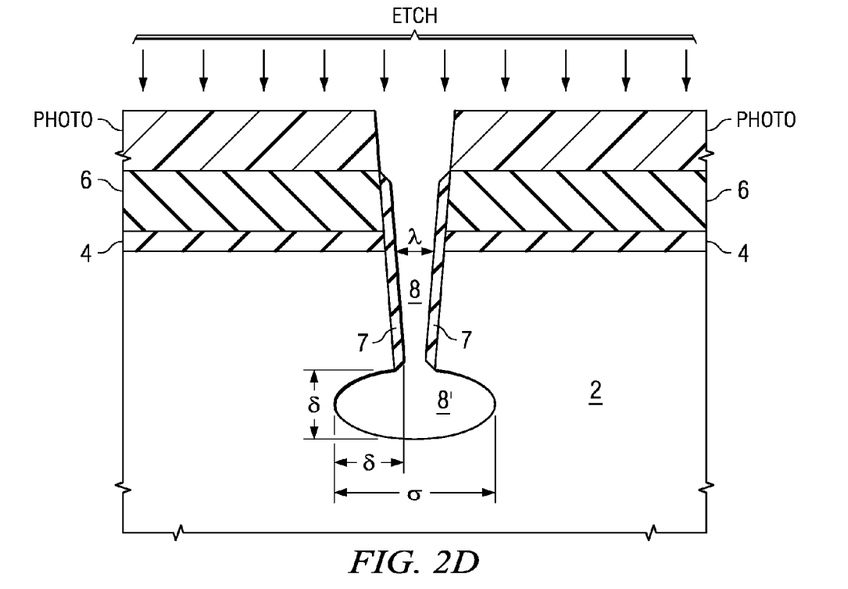

Next, turning to FIG. 2D, a third dry etch process is applied on the substrate to create a significantly widened space 8' at the bottom of trench 8. In one preferred embodiment, the etch process is an in-situ, isotropic plasma etch process conducted in a same plasma etch chamber. In the preferred embodiment, the etchant gas is a mixture of $SF_6$, He, and $O_2$, with the flow rate of the carrier gas adjusted to maintain a pressure of between about 5 mTorr and about 20 mTorr in the etching chamber. During the etch process, the substrate is DC biased between about 50 volts and about 200 volts, while an RF discharge having a power of from about 50 Watts to about 1000 Watts is struck in the etch chamber. The third etch process is also a time-controlled process, and it continues until the desired profile and dimension of widened space 8' is obtained. Polymer deposition 7, formed during previous etch step, acts as a barrier layer, which prevents the sidewalls of trench 8 from being etched in the current etch step.

In the currently described embodiment, the widened space 8' formed by the isotropic plasma etch process has a convex shape, where the lateral widening from the bottom corner of trench 8 is about the same as the widening in the vertical direction, due to the isotropic nature of the third etch process. This dimension is labeled as "δ" in FIG. 2D and is within the range of from about 50 Å to about 1500 Å. Thus, the width "σ" of widened space 8' is from about 100 Å to about 3000 Å larger than the width of trench 8 bottom. In preferred embodiments, "σ" can be either smaller or larger than trench 8 opening "λ" along the surface of semiconductor substrate 2.

Figure 2E:
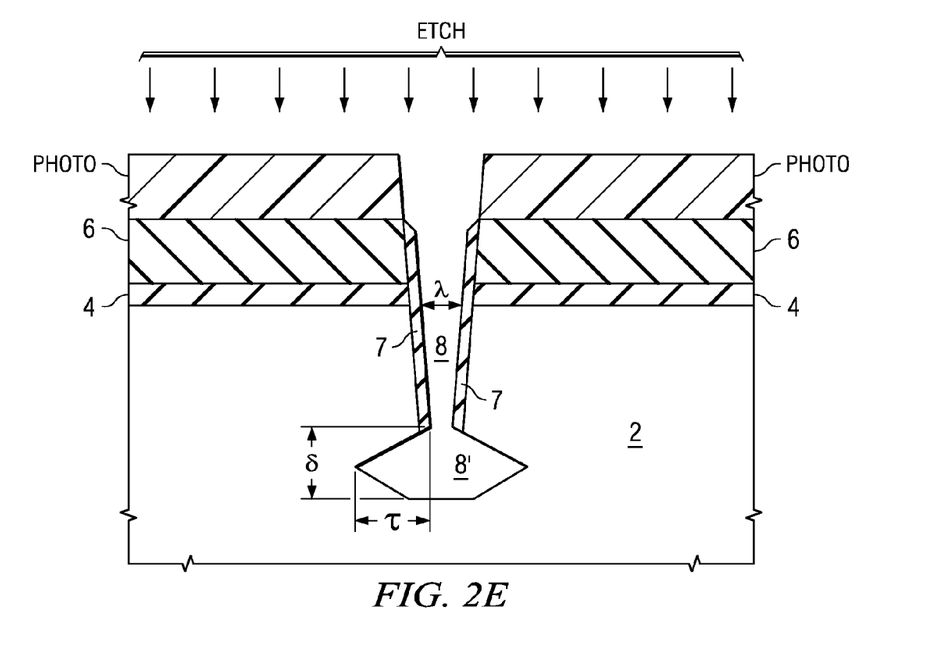

Shown in FIG. 2E is another preferred embodiment using a modified isotropic etching recipe in the third dry etch process. Widened space 8' formed at the bottom of trench 8 has a diamond-shaped profile with a substantially flat bottom and tapered sidewalls. Similarly, the lateral widening "τ" from the bottom corner of trench 8 is about the same as the widening "δ" in the vertical direction, due to the isotropic nature of the etch process.

In an additional and/or alternative embodiment, an RIE is used to create widened space 8', wherein both physical and chemical processes are involved for the etching. In additional preferred embodiments, widened space 8' of various profiles is formed through isotropic or anisotropic etching recipe of different kinds.

After the formation of the widened space 8', a known plasma ashing process is conducted, removing photoresist on the substrate surface and polymer deposition 7 on trench 8 sidewalls. In a preferred embodiment, an in-situ, low pressure oxygen ($O_2$) plasma ashing is used. The profile of bottom-widened trench 9 is thus formed and illustrated in FIG. 2F, having a tapered, trench-shaped top portion and a widened bottom portion. The widened bottom portion of trench 9 can have various depth, aspect ratios, shapes and profiles, depending upon the etch recipe used for the etch processes. In preferred embodiments, the depth of trench 9 falls primarily in the range of from about 1100 Å to about 7000 Å.

Figure 2F:
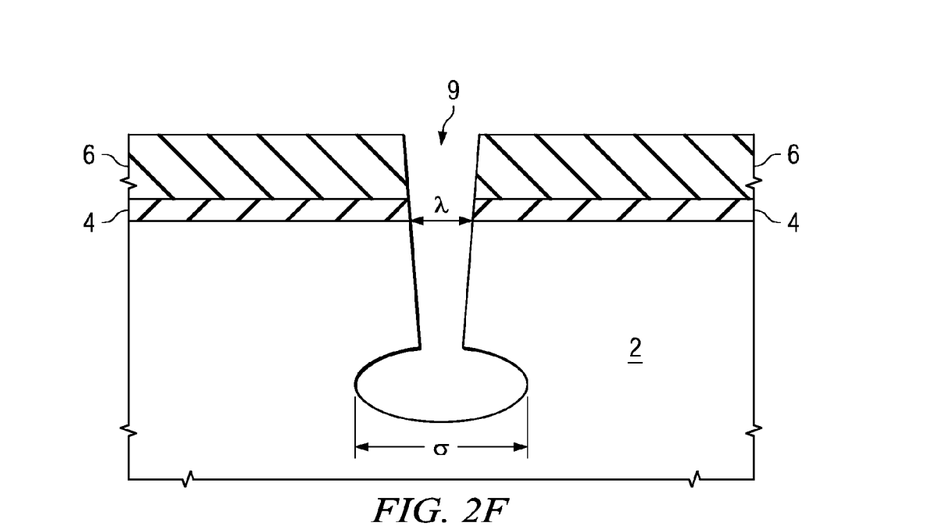

Embodied bottom-widened trench 9 can be roughly categorized into two major types, based upon the relative size between surface opening "λ" and the lateral dimension "σ" of the widened bottom portion. In one preferred embodiment, bottom-widened trench 9 has a surface opening "λ" smaller than 100 nanometer, and the bottom dimension "σ" is larger than surface opening "λ" as shown in FIG. 2F. This STI configuration occupies much less substrate surface area, while still being able to provide desired isolation characteristics due to its substantially widened bottom portion. However, filling bottom-widened trench 9 in the subsequent processing step may lead to undesirable void and/or seam formation in the widened bottom portion. This STI configuration may be preferably used when the aspect ratio of bottom-widened trench 9 is less than about 3.5:1.

Figure 2G:
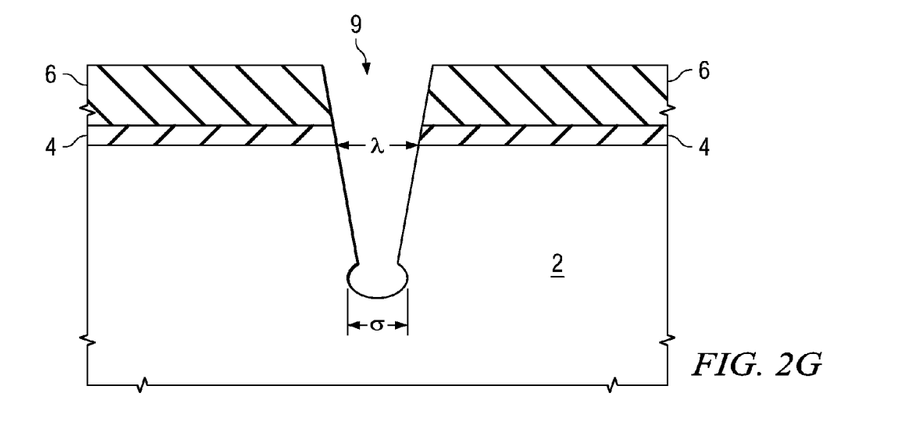

FIG. 2G illustrates a bottom-widened trench 9 profile formed in another preferred embodiment, where the bottom dimension "σ" is smaller than surface opening "λ." This STI configuration provides a lowered sidewall slope and a moderately widened bottom portion, thus facilitating a desirable void-free and/or seam-free filling in bottom-widened trench 9. However, this bottom-widened trench 9 configuration generally takes more substrate surface area and is preferably used when bottom-widened trench 9 has an aspect ratio greater than about 5:1.

Alternatively, a known implantation process may be performed in the bottom of bottom-widened trench 9 to create a channel-stop doping layer (not shown) under the field oxide. A channel-stop doping layer can suppress n+-to-N-well, p+-to-P-well leakage. A channel-stop doping may also improve well conductivity, thus preventing a CMOS latch-up from happening.

Continuing in FIG. 2H, bottom-widened trench 9 is subsequently filled with suitable dielectric materials by a known deposition process. In one preferred embodiment, silicon oxide is filled by a chemical vapor deposition CVD process. In another preferred embodiment, undoped silicate glass (USG) is filled in bottom-widened trench 9. In additional and/or alternative embodiments, a low pressure CVD (LPCVD) silicon oxide deposition, a high density plasma (HDP) silicon oxide deposition, a TEOS silicon oxide deposition, or an atmospheric pressure CVD (APCVD) silicon oxide deposition may also be used to fill bottom-widened trench 9, although other suitable STI filling materials and processes are not excluded. In a further embodiment, a first dielectric material having a better filling property is filled in the widened bottom portion of bottom-widened trench 9, while a second dielectric material is used to fill the sloped top portion of bottom-widened trench 9. To clarify description, bottom-widened trench 9 filled with a dielectric material is referred to as bottom-widened STI 9' from hereafter.

Figure 2H:
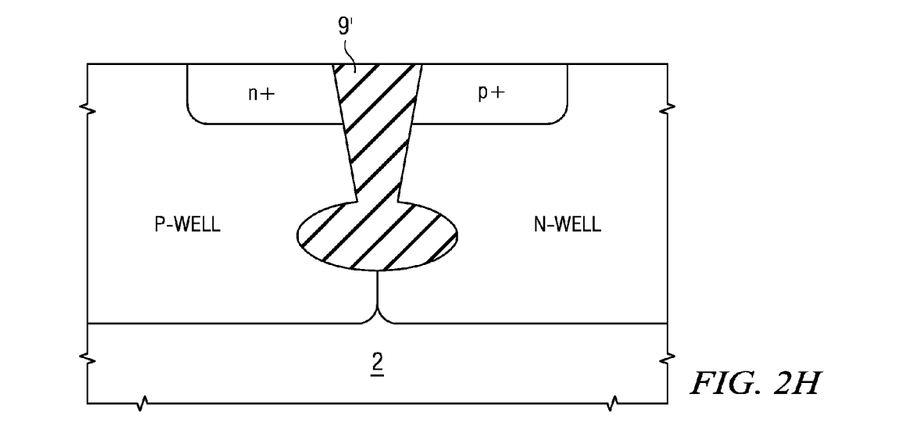

Remaining in FIG. 2H, a known planarization process, such as CMP, is applied on the substrate surface to remove the excess silicon oxide. A known etch process is used to removed dielectric layers 4 and 6. Known implantation processes are conducted to form P-well and N-well in semiconductor substrate 2. Known doping or implantation processes are conducted to form n+ and p+ active regions in P-well and N-well, respectively. A cross-sectional view after these processing steps is illustrated in FIG. 2H. A conventional CMOS process flow may continue at this point to finish the remaining processing steps necessary for manufacturing the IC.

Figure 3:
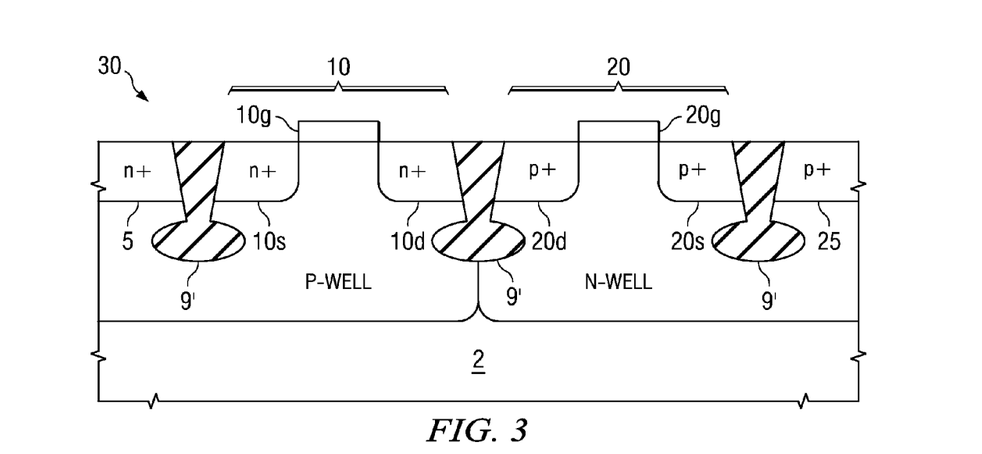
FIG. 3 shows a cross-sectional view of a semiconductor device, where an embodied device isolation is used.

Illustrated in FIG. 3 is a cross-sectional view of semiconductor device 30, where the embodied bottom-widened STI 9' is used in an IC of advanced technology as an inter-well isolation to separate n+ region $10d$ of NMOS transistor 10 and p+ region $20d$ of PMOS transistor 20. Bottom-widened STI 9' is also used as an intra-well isolation to separate n+ region $10s$ and an adjacent n+ region 5 in the P-well, p+ region $20s$ and an adjacent p+ region 25 in the N-well, respectively.

Several advantageous features of using bottom-widened STI 9' in an IC as above bear noting. First, the inter-well STI isolation spacing is significantly reduced due to the shrunken, top portion dimension of bottom-widened STI 9', which enables a significant increase in circuit density. Second, the widened bottom portion of bottom-widened STI 9' provides the desired n+-to-N-well and p+-to-P-well spacing, thus, enabling the desired isolation characteristics even when device scaling gets into the nanometer range. Third, bottom-widened STI 9' having a substantially reduced aspect ratio can provide comparable isolation characteristics when compared with a prior art STI. These desired isolation characteristics include low inter-well and intra-well leakage current, immunity of lateral punchthrough in the parasitic field device, and immunity of CMOS latchup. Fourth, the widened bottom portion of bottom-widened STI 9' provides a significantly improved tolerance during the photolithography process of aligning N-well and P-well with bottom-widened STI 9'. Such improvement may lead to an increase in device yield.

Figure 4:
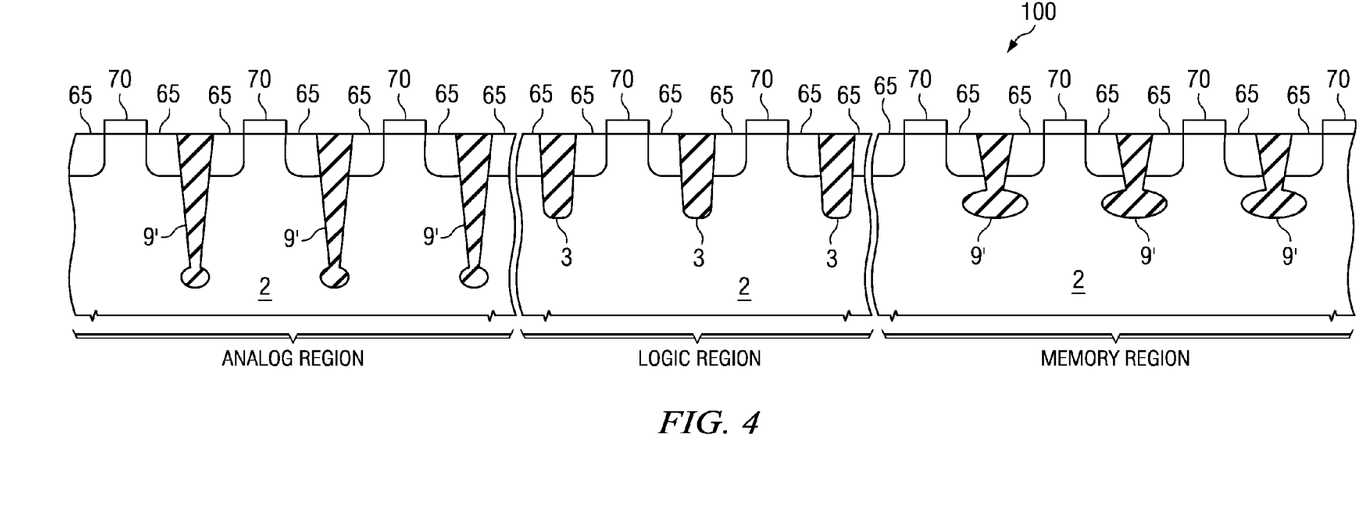
FIG. 4 shows a cross-sectional view of a semiconductor device in an SOC configuration, where embodied devices isolations of different types are used to in different functional regions.

Illustrated in FIG. 4 is a cross-sectional view of a portion of a CMOS IC in a system-on-a-chip (SOC) configuration. SOC 100 embodies the preferred bottom-widened STI 9' structure described above and is illustrated to further explain how bottom-widened STI 9' can be used to provide desired device isolation. In FIG. 4, SOC 100 comprises various functional regions, such as an analog region, a logic region, and a memory region formed on semiconductor substrate 2. These functional regions may be formed adjacent to each other, or in separate locations on semiconductor substrate 2 (illustrated in FIG. 4 by the wavy lines). Within each functional region of SOC 100, there is a plurality of active regions 65 formed in wells (not shown) of both conductivity types. Active regions 65 adjacent to each other in FIG. 4 may include MOS device source/drain regions formed in a common well or in wells of opposite conductivity types. These MOS devices also comprise gate regions 70, as shown in FIG. 4. Inter-well and intra-well field isolations of different types are used to separate adjacent active regions 65.

In an analog region of FIG. 4, a minimum possible noise current is typically desired, while device density is less critical. Field isolations with a best possible isolation characteristic are preferably used to prevent leakage current between adjacent devices. In order to meet this requirement, a deep isolation structure with a large aspect ratio is normally used, which generally involves complex and difficult etching steps. In a preferred embodiment, bottom-widened STI 9', having a profile as illustrated in FIG. 2G, is preferably used in an analog region of SOC 100, instead of a conventional, trench-shaped deep isolation. Advantageous features include the following: First, bottom-widened STI 9' has a reduced aspect ratio (less than about 8:1), while still being able to provide the desired isolation characteristics, due to its widened bottom. Second, filling bottom-widened trench 9, having a profile as illustrated in FIG. 2G, is much easier due to its significantly widened surface opening, lowered sidewall slope and moderately widened bottom profile.

In contrast, a highest possible device density is generally desired in a memory region in FIG. 4. This, in turn, translates into a demand for a field isolation structure that takes a minimum possible substrate area. As explained earlier, conventional STI 3 (illustrated in FIG. 1) with a shrunken dimension may cause detrimental effects, such as increased leakage current, lateral punchthrough, and/or CMOS latchup. In a preferred embodiment, bottom-widened STI 9', having a profile as illustrated in FIG. 2F, is preferably used instead of conventional STI 3 in an embedded SRAM memory cell region. Advantageous features include the following: bottom-widened STI 9', as illustrated in FIG. 2F, can be formed with a significantly reduced surface area, while still being able to provide the desired isolation characteristics, due to the significantly widened bottom. In additional and/or alternative embodiments, bottom-widened STIs 9', having a profile illustrated in FIG. 2F, are used to provide desired isolation in other on-chip, non-volatile memory regions (not shown), such as an embedded DRAM region, In a logic region in FIG. 4, conventional STIs 3 are used to provide desired device isolation. In generally, a logic region may tolerate a certain level of noise current without causing circuit malfunction, and the circuit density is not as demanding as that in a memory region. In another preferred embodiment, bottom-widened STIs 9' used in an analog region may be adopted in a logic region when better isolation characteristics are desired. In an additional preferred embodiment, bottom-widened STIs 9' used in a memory region are adopted in a logic region when higher circuit density is desired.

Figure 5A:
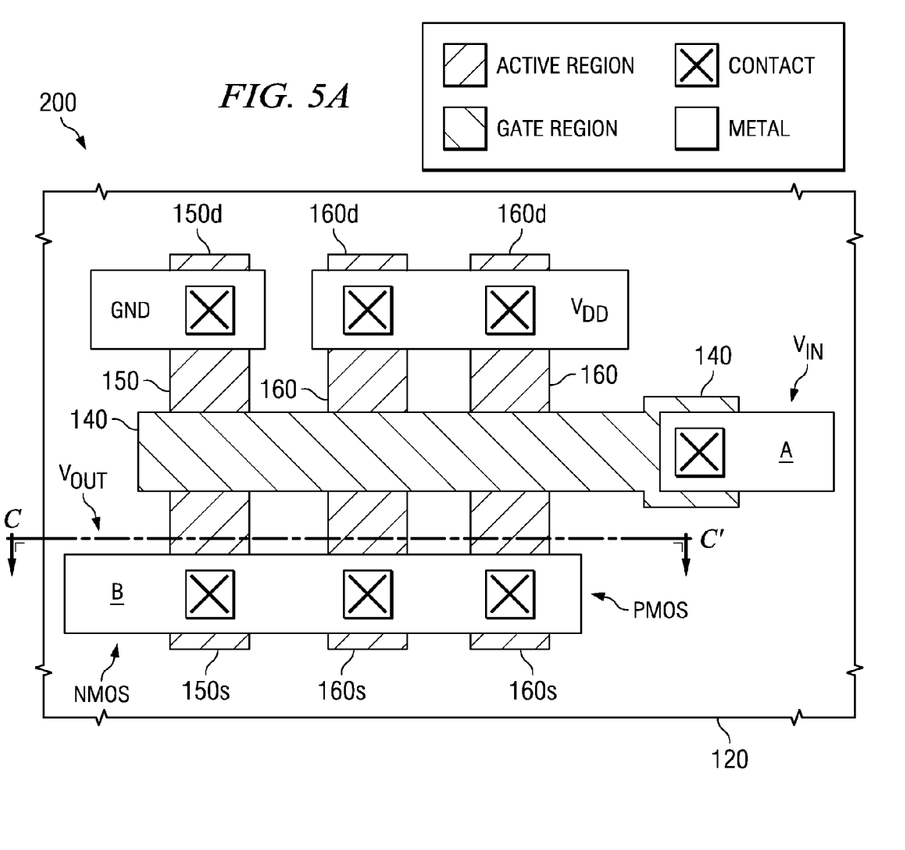
FIG. 5A is a top view of a logic inverter made of MOS transistors in a FinFET configuration.

In a further embodiment, bottom-widened STIs 9' described above are employed in forming isolation between adjacent vertical MOS transistors, such as a FinFET MOS transistor. As is known in the art, FinFET MOS transistors have a 3-D configuration when compared with the conventional planar MOS transistor configuration. FinFET structures are known to suppress short channel effects and maintain desired drive current when MOS device dimension scales down to the nanometer range. FIG. 5A shows a top view of a logic inverter 200 made from FinFET NMOS and PMOS transistors. FinFET NMOS transistor includes a single 3-D silicon fin (active region) 150. FinFET PMOS transistor includes two 3-D silicon fins 160. Silicon fins 150 and 160 are both fabricated on an insulating substrate 120. A 3-D polysilicon gate 140 extends horizontally across silicon fins 150 and 160, and separates each silicon fin into two isolated portions, which constitute the source/drain regions 150s, 150d of the NMOS, 160s and 160d of the PMOS, respectively. Also, drain region 160d and 150d are coupled to a supply voltage Vdd and ground, GND, respectively. After the formation of the FinFET MOS transistors, field oxide layer 145 (shown in FIG. 5B) is deposited on the substrate to isolate adjacent active regions 150 and 160. In operation, when an input voltage Vin (e.g., logic high) is applied on node A that is coupled to gate 140, an inverted output voltage Vout (e.g., logic low) can be obtained on node B, which is coupled to source regions 150s and 160s.

Figure 5B:
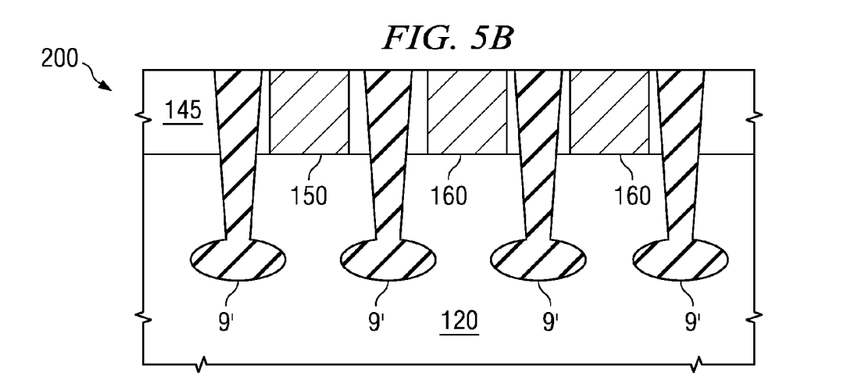
FIG. 5B shows a cross-sectional view of the logic inverter in FIG. 5A, illustrating how an embodied isolation of the current invention is used to provide isolation between adjacent active regions.

FIG. 5B is a cross-sectional view of logic inverter 200 in the area noted as C-C' in FIG. 5A, illustrating how embodied bottom-widened STIs 9' of the current invention are used to provide isolation between adjacent active regions 150 and 160 in a FinFET MOS transistor configuration. When active regions having a vertical configuration are formed in a semiconductor device, such as the 3-D silicon fin in a FinFET transistor, a deep isolation is generally desired to provide adequate isolation characteristics. However, as described earlier, creating deep trench isolations with a very large aspect ratio in the nanometer range is extremely difficult to accomplish, if not impossible. By adopting embodied bottom-widened STIs 9' of the current invention, the needed trench depth can be substantially reduced, while still being able to provide the desired isolation characteristics.

Although the present invention and its advantages have been described in detail, it should be understood that various changes, substitutions and alterations can be made herein without departing from the spirit and scope of the invention as defined by the appended claims. For example, in another embodiment, bottom-widened STI 9' can be ready adopted to provide desire isolations between devices having a vertical structure, such as vertical bipolar transistors in an analog IC. In yet another embodiment, bottom-widened STIs 9' are used to provide isolation in a flash memory chip, which leads to a substantial increase in memory capacity. As another example, it will be readily understood by those skilled in the art that materials, process steps, process parameters in forming the preferred embodiments may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
    a semiconductor substrate;
    a trench located in said semiconductor substrate, wherein said trench has a first portion tapering in width from wide to narrow in a direction from a substrate surface, from a first width at a top of the first portion to a second width at a bottom of the first portion;
    a second portion of said trench below the first portion, wherein the second portion has a cavity that expands from the bottom of the first portion to a lateral distance having a third width, wherein the cavity has a diamond-shaped profile with a flat bottom and tapered sidewalls;
    a filler material in said trench, wherein said filler material is in direct contact with said semiconductor substrate; and
    wherein the third width is substantially larger than the second width.

2. The semiconductor structure of claim 1, wherein the third width is substantially larger than the first width.

3. The semiconductor structure of claim 1, wherein said semiconductor substrate comprises one of doped silicon, silicon germanium, gallium arsenide, compound semiconductor, multi-layers semiconductor, silicon on insulator (SOI), and any combination thereof.

4. The semiconductor structure of claim 1, wherein said filler material comprises one of CVD silicon oxide, LPCVD silicon oxide, HDP silicon oxide, TEOS silicon oxide, APCVD oxide, undoped silicate glass, and any combination thereof.

5. The semiconductor structure of claim 1, wherein the third width is from about 100 Å to about 3000 Å larger than the second width.

6. The semiconductor structure of claim 1, wherein an aspect ratio of said trench is greater than 5:1.

7. The semiconductor structure of claim 1, wherein the first width is smaller than 100 nm.

8. A semiconductor device comprising:
    a substrate having a first active region and a second active region;
    a trench isolation located in said substrate separating the first active region and the second active region;
    wherein said trench isolation has a first portion tapering in width from wide to narrow in a direction from a substrate surface, from a first width at a top of the first portion to a second width at a bottom of the first portion, the first width and the second width each extending from a first sidewall of the substrate to a second sidewall of the substrate, the first sidewall and the second sidewall each comprising a semiconductor material, the first portion having a uniform material from the first sidewall of the substrate to the second sidewall of the substrate; and
    wherein said trench isolation has a second portion below the first portion, the second portion having a widened shape that expands from the bottom of the first portion to a lateral distance having a third width, which is larger than the second width and is smaller than the first width.

9. The semiconductor device of claim 8, wherein said trench isolation is made from one or more materials comprising one of: CVD silicon oxide, LPCVD silicon oxide, HDP silicon oxide, TEOS silicon oxide, APCVD oxide, undoped silicate glass, and any combination thereof.

10. The semiconductor device of claim 8, wherein said substrate is a semiconductor substrate comprising one of: doped silicon, silicon germanium, gallium arsenide, compound semiconductor, multi-layers semiconductor, silicon on insulator (SOI), and any combination thereof.

11. The semiconductor device of claim 8 further comprising a P-well and an N-well, wherein the first active region is an N-type drain region of a planar NMOS located in the P-well, wherein the second active region is a P-type drain region of a planar PMOS located in the N-well.

12. The semiconductor device of claim 8, wherein the first and second active regions are source/drain regions of adjacent planar MOS transistors located in a common one of a P-well and an N-well.

13. The semiconductor device of claim 8, wherein the first and second active regions have a 3-D structure and are source/drain regions of MOS transistors having a FinFET configuration.

14. The semiconductor device of claim 8, wherein a depth of said trench isolation is in a range of from about 1100 Å to about 7000 Å.

15. A semiconductor device comprising:
a semiconductor substrate having a logic region and a memory cell region;
a plurality of active regions located in said logic region and said memory cell region;
a first plurality of isolations of a first type located in said logic region, separating adjacent ones of said plurality of active regions;
a second plurality of isolations of a second type located in said memory cell region, separating adjacent other ones of said plurality of active regions;
wherein each of the plurality of isolations of the first type has a trench shape; and
wherein each of the plurality of isolations of the second type comprises a first portion tapering in width from wide to narrow in a direction from a surface of the semiconductor substrate, from a first width at a top of the first portion to a second width at a bottom of the first portion, and a second portion below the first portion and having a widened shape that expands from the bottom of the first portion to a lateral distance having a third width, the third width being larger than the second width.

16. The semiconductor device of claim 15, wherein each of the plurality of isolations of the second type has a smaller aspect ratio than that of the first type, and the third width is substantially larger than the first width.

17. The semiconductor device of claim 15, wherein said memory cell region comprises one of: an SRAM cell region, a DRAM cell region, a flash memory cell region.

18. The semiconductor device of claim 15, wherein said semiconductor substrate further comprises:
an analog region;
a plurality of conductive regions formed in said analog region; and
a third plurality of isolations of the second type located in said analog region, wherein one or more of said plurality of active regions are located in said analog region.

19. The semiconductor device of claim 18, wherein each of the isolations in said analog region has a third width substantially smaller than the first width.

* * * * *